(12) United States Patent
Kageyama

(10) Patent No.: US 8,198,732 B2
(45) Date of Patent: Jun. 12, 2012

(54) SEMICONDUCTOR DEVICE

(75) Inventor: Satoshi Kageyama, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 12/153,587

(22) Filed: May 21, 2008

(65) Prior Publication Data
US 2008/0290517 A1    Nov. 27, 2008

(30) Foreign Application Priority Data
May 22, 2007   (JP) ................. 2007-135160

(51) Int. Cl.
*H01L 23/48*      (2006.01)
(52) U.S. Cl. ............... 257/774; 257/E23.161
(58) Field of Classification Search ............ 257/751, 257/758, 734, 753, 774, E23.01, E21.511, 257/E21.578, E23.161
See application file for complete search history.

(56) References Cited

U.S. PATENT DOCUMENTS

| | | | | |
|---|---|---|---|---|
| 6,781,237 | B2 * | 8/2004 | Ikeda et al. | 257/758 |
| 7,196,420 | B1 * | 3/2007 | Burke et al. | 257/751 |
| 7,439,185 | B2 * | 10/2008 | Kojima | 438/700 |
| 7,507,666 | B2 * | 3/2009 | Nakao et al. | 438/687 |
| 2005/0218519 | A1 | 10/2005 | Koike et al. | |
| 2008/0057704 | A1 | 3/2008 | Koike et al. | |

FOREIGN PATENT DOCUMENTS

JP    2005-277390    10/2005

* cited by examiner

*Primary Examiner* — Hoa B Trinh
(74) *Attorney, Agent, or Firm* — Rabin & Berdo, P.C.

(57) ABSTRACT

A semiconductor device of the present invention includes an insulating film made of a low dielectric constant material having a smaller specific dielectric constant than $SiO_2$, a wiring trench formed in the insulating film, a first barrier film made of $SiO_2$ or SiCO formed at least on the side surface of the wiring trench, Cu wiring mainly composed of Cu embedded in the wiring trench, and a second barrier film made of a compound containing Si, O and a predetermined metallic element covering the surface of the Cu wiring opposed to the wiring trench.

7 Claims, 3 Drawing Sheets

SEMICONDUCTOR DEVICE

BACKGROUND OF THE INVENTION

1. Field of the Invention

The present invention relates to a semiconductor device having Cu wiring mainly composed of Cu (copper).

2. Description of Related Art

Following increase in the scale of integration of a semiconductor device, further refinement of wiring has been required. In order to suppress increase in wiring resistance resulting from refinement of the wiring, it is under examination to apply Cu (copper) having higher conductivity to the material for the wiring, in place of conventionally employed Al (aluminum).

Since it is difficult to finely pattern Cu by dry etching or the like, Cu wiring is formed by the so-called damascene process. According to the damascene process, a fine wiring trench corresponding to a predetermined wiring pattern is first formed in an insulating film made of $SiO_2$ (silicon oxide). A Cu film is formed in such a thickness as to fill up the wiring trench and cover the entire surface of the insulating film. Thereafter the Cu film is polished by CMP (Chemical Mechanical Polishing). This polishing of the Cu film is continued until parts of the Cu film outside the wiring trench are entirely removed and the surface of the insulating film outside the wiring trench is exposed. Thus, the Cu film remains only in the wiring trench, and a Cu wiring embedded in the wiring trench is obtained.

However, Cu has higher diffusibility into the insulating film as compared with Al. If the Cu wiring (the Cu film) is directly formed on the insulating film, therefore, Cu may diffuse into the insulating film to cause an interwiring short circuit or the like. Therefore, a barrier film must be formed between the insulating film and the Cu wiring, in order to prevent Cu from diffusing into the insulating film.

In relation to this barrier film, there has been proposed a method of forming a CuMn alloy film made of an alloy of Cu and Mn (manganese) on an insulating film provided with a wiring trench in advance of formation of a Cu film, and performing heat treatment after the formation of the Cu film, thereby diffusing Mn contained in the alloy film into the interface between the alloy film and the insulating film to form a barrier film made of $Mn_xSi_yO_z$ (x, y and z: numbers greater than zero) on this interface.

Following refinement of the wiring, on the other hand, the interwiring distance is reduced, and hence the electric capacitance (interwiring capacitance) between adjacent wirings is disadvantageously increased. This problem can be solved by employing the so-called Low-k material (SiOC or SiOF, for example) having a small specific dielectric constant as the material for the insulating film.

However, an insulating film made of a Low-k material has a small film density due to a large number of holes (pores) present therein. When a CuMn alloy film is formed on this insulating film, therefore, the CuMn alloy disadvantageously easily infiltrates into the insulating film. Further, when a wiring trench is formed in the insulating film, the holes may be partially exposed, to result in forming recesses on the inner surface of the wiring trench. In addition, the insulating film made of the Low-k material has a smaller concentration of O (oxygen) as compared with an insulating film made of $SiO_2$, and hence it is difficult to form a barrier film made of $Mn_xSi_yO_z$ thereon.

In order to solve these problems, the thickness of the CuMn alloy film may be increased. If the thickness of the CuMn film is increased, however, Mn diffuses into the Cu wiring in excess of the quantity necessary for forming the $Mn_xSi_yO_z$ barrier film, to increase the wiring resistance of the Cu wiring.

SUMMARY OF THE INVENTION

An object of the present invention is to provide a semiconductor device capable of preventing Cu from diffusing into an insulating film made of a low dielectric constant material (a Low-k material) from Cu wiring and preventing increase in the wiring resistance of the Cu wiring.

A semiconductor device of the present invention includes: an insulating film made of a low dielectric constant material having a smaller specific dielectric constant than $SiO_2$; a wiring trench formed in the insulating film; a first barrier film made of $SiO_2$ or SiCO formed at least on the side surface of the wiring trench; Cu wiring mainly composed of Cu embedded in the wiring trench; and a second barrier film made of a compound containing Si, O and a predetermined metallic element covering the surface of the Cu wiring opposed to the wiring trench.

In this semiconductor device, the wiring trench is formed in the insulating film made of the low dielectric constant material having a smaller specific dielectric constant than $SiO_2$. The first barrier film made of $SiO_2$ or SiCO is formed at least on the side surface of the wiring trench. The Cu wiring mainly composed of Cu is embedded in the wiring trench. The second barrier film is formed to cover the surface of the Cu wiring opposed to the wiring trench.

The second barrier film is formed in a manner such that a metal film (a CuMn alloy film, for example) containing the predetermined metallic element is formed in the wiring trench, and then the predetermined metallic element is bonded to Si and O contained in the insulating film or the first barrier film each other, for example. At this time, the constituent (the CuMn alloy, for example) of the metal film can be prevented from infiltrating into the insulating film, since the first barrier film made of $SiO_2$ or SiCO having a larger film density than the lower dielectric constant material is formed at least on the side surface of the wiring trench. Even if the thickness of the metal film is reduced, therefore, a sufficient quantity of the constituent of the metal film can be ensured for forming the second barrier film.

The film density denotes the volume occupied by the constituent of the film in a predetermined volume of each of the insulating film and the first barrier film. When the first barrier film and the interlayer insulating film are identical in volume to each other, the first barrier film having a larger film density has a smaller number of spatial portions such as holes (pores).

Even if recesses are formed on the inner surface (the side surface, for example) of the wiring trench, the first barrier film fills up the recesses so that the surface provided with the metal film can be planarized. Therefore, the thickness of the metal film may not be increased in order to planarize the inner surface of the wiring trench by filling up the recesses. In other words, the thickness of the metal film can be reduced.

Thus, since the thickness of the metal film can be reduced, even if the metal film contains a resistive component (Mn, for example) increasing the wiring resistance of the Cu wiring, this resistive component is fully used as the constituent of the second barrier film. Therefore, Mn does not diffuse into the Cu wiring. Consequently, increase in the wiring resistance of the Cu wiring can be prevented.

The surface of the Cu wiring opposed to the wiring trench is covered with the second barrier film, whereby Cu can be prevented from diffusing into the insulating film from the Cu wiring.

In the semiconductor device according to the present invention, the predetermined metallic element is preferably Mn. In this case, the second barrier film covering the surface of the Cu wiring opposed to the wiring trench is made of $Mn_xSi_yO_z$ (x, y and z: numbers greater than zero). If the first barrier film is formed by a film having a larger content of O (oxygen) than the insulating film, Mn contained in the metal film formed in the wiring trench can easily react with O, whereby the second barrier film ($Mn_xSi_yO_z$) can be efficiently formed.

The foregoing and other objects, features and effects of the present invention will become more apparent from the following detailed description of the embodiments with reference to the attached drawings.

DETAILED DESCRIPTION OF THE INVENTION

Figure 1A:
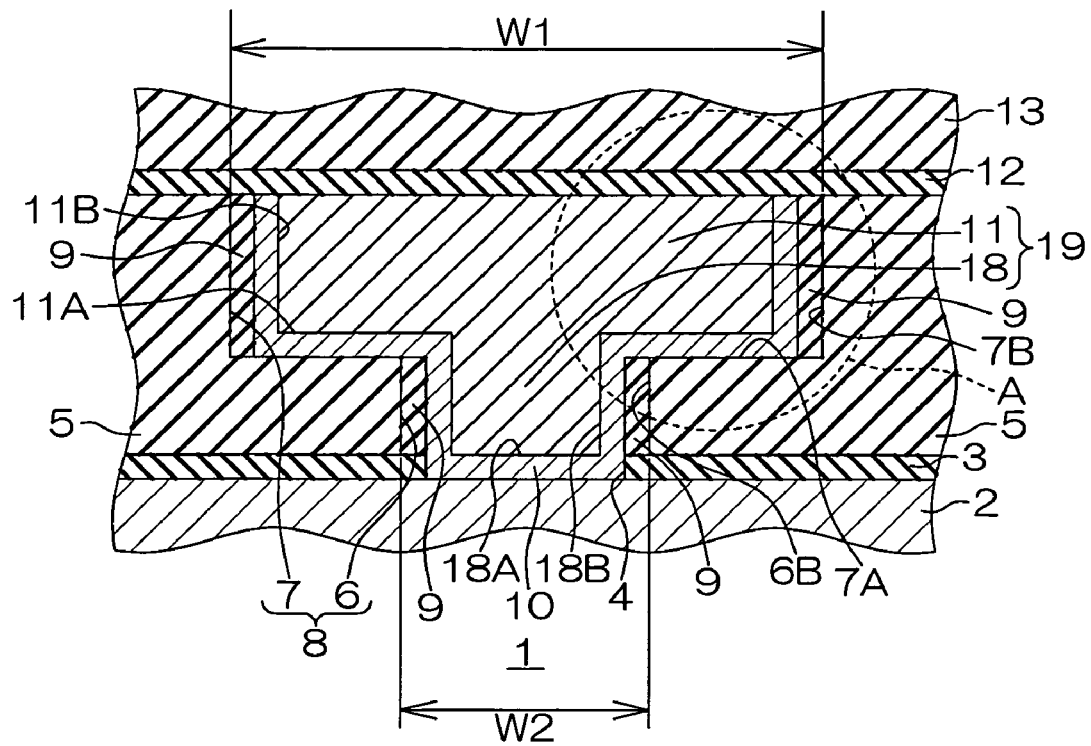
FIG. 1A is an illustrative sectional view for illustrating the structure of a semiconductor device according to a first embodiment of the present invention, showing a principal part of a wiring structure in an enlarged manner.
Figure 1B:
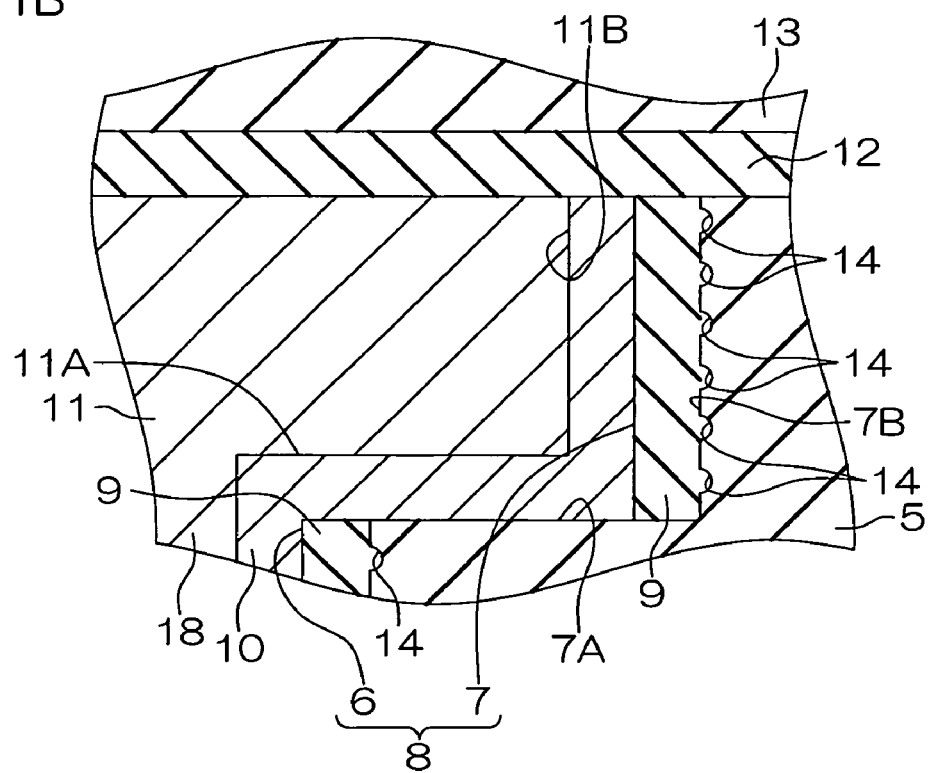
FIG. 1B is an enlarged view showing a part enclosed with a circle A in FIG. 1A.

FIG. 1A is an illustrative sectional view for illustrating the structure of a semiconductor device according to a first embodiment of the present invention, showing a principal part of a wiring structure of the semiconductor device in an enlarged manner. FIG. 1B is an enlarged view showing a part enclosed with a circle A in FIG. 1A.

This semiconductor device 1 is a semiconductor device having a damascene multilayer structure, and includes first Cu wiring 2 formed by a damascene process on a semiconductor substrate (not shown).

The first Cu wiring 2 is made of a Cu alloy mainly composed of Cu (copper). Examples of the Cu alloy include alloys of Cu and Mg (magnesium), Ti (titanium), Mo (molybdenum), Ta (tantalum) and Cr (chromium), and the Cu alloy may contain not less than two of these metals.

A first diffusion preventing film 3 made of SiC (silicon carbide), for example, is laminated on the first Cu wiring 2.

The first diffusion preventing film 3 is provided to prevent Cu contained in the first Cu wiring 2 from diffusing into an interlayer insulating film 5 described later. A through-hole 4 is formed in the first diffusion preventing film 3, to penetrate the first diffusion preventing film 3 in the thickness direction from the surface thereof. The through-hole 4 is so formed that the first Cu wiring 2 is partially exposed from the first diffusion preventing film 3.

The interlayer insulating film 5 (insulating film) is laminated on the first diffusion preventing film 3.

The interlayer insulating film 5 is made of a low dielectric constant material (a Low-k material) having a smaller specific dielectric constant than $SiO_2$ (silicon oxide: specific dielectric constant k=4.0 to 4.2). Examples of such a Low-k material include SiOC (carbon-doped silicon oxide: specific dielectric constant k=not more than 3) and SiOF (fluorine-doped silicon oxide: specific dielectric constant k=not more than 3). According to this embodiment, the interlayer insulating film 5 is made of SiOC.

SiOC contains 38 atomic percent to 46 atomic percent of O (oxygen) and 23 atomic percent to 37 atomic percent of C (carbon), for example. SiOF contains 55 atomic percent to 57 atomic percent of 0 and 10 atomic percent to 12 atomic percent of F (fluorine), for example. When the interlayer insulating film 5 is made of SiOC, the specific dielectric constant between the first Cu wiring 2 and a second Cu wiring 11 (described later) can be reduced, for example, whereby increase in the interwiring capacitance between the first Cu wiring 2 and the second Cu wiring 11 can be prevented.

A wiring trench 8 is formed in the interlayer insulating film 5, to penetrate the interlayer insulating film 5 in the thickness direction from the surface thereof.

The wiring trench 8 includes a trench 7 formed on the surface layer portion of the interlayer insulating film 5 in a predetermined pattern (wiring pattern) and a via hole 6 reaching the through-hole 4 from a position of the bottom surface 7A of the trench 7 located directly above the through-hole 4. As hereinabove described, the interlayer insulating film 5 is made of SiOC, and hence a large number of holes (pores) are present in the interlayer insulating film 5. When the wiring trench 8 is formed, therefore, these holes may be partially exposed, to result in a plurality of recesses 14 on the inner surface of the wiring trench 8 (side surfaces 7B and 6B of the trench 7 and the via hole 6 in this embodiment), as shown in FIG. 1B.

A first barrier film 9 is formed on the inner surface of the wiring trench 8 (the side surfaces 7B and 6B of the trench 7 and the via hole 6 in this embodiment). Even if the recesses 14 are present on the inner surface of the wiring trench 8, therefore, the first barrier film 9 partially fills up these recesses 14 (see FIG. 1B).

The first barrier film 9 is made of $SiO_2$ or SiCO (oxygen-doped silicon carbide). $SiO_2$ is a material having a larger content of O (oxygen) as compared with SiOC. The first barrier film 9 made of $SiO_2$ has a larger film density as compared with the interlayer insulating film 5 made of SiOC. The film density denotes the volume occupied by the constituent of the film in a predetermined volume of each of the first barrier film 9 and the interlayer insulating film 5. When the first barrier film 9 and the interlayer insulating film 5 are identical in volume to each other, the first barrier film 9 having a larger film density has a smaller number of spatial portions such as holes (pores).

On the other hand, SiCO is a material having the same element composition as SiOC, but having the different element content. More specifically, SiCO contains 50 atomic percent to 70 atomic percent of C and 4 atomic percent to 11 atomic percent of O, for example. The first barrier film 9 made of SiCO has a larger film density than the interlayer insulating film 5 made of SiOC. An insulating film having a larger film density and a larger O content than the insulating film made of SiOC can also be formed as the insulating film made of SiCO, and the first barrier film 9 is preferably formed by such an insulating film.

A second barrier film 10 is formed on the inner surface of the wiring trench 8 including the region located on the barrier film 9, more specifically on the surface of the first barrier film 9, the bottom surface 7A of the trench 7 and the exposed surface of the first Cu wiring 2.

The second barrier film 10 is made of $Mn_xSi_yO_z$ (x, y and z: numbers greater than zero), for example. Depending on a width W1 of the trench 7 (in a direction orthogonal to the longitudinal direction in plan view) and a width (diameter) W2 of the via hole 6, the thickness of the second barrier film 10 is 1.5 nm to 25 nm if the width W1 of the trench 6 is 100 nm to 1000 nm and the width W2 of the via hole 6 is 100 nm to 300 nm, for example.

A Cu wiring portion 19 is embedded in the wiring trench 8 provided with the second barrier film 10. In other words, the surface of the Cu wiring portion 19 opposed to the wiring trench 8 (bottom and side surfaces 11A and 11B of the Cu wiring 11 (described later) and bottom and side surfaces 18A and 18B of a connection via 18 (described later) in this embodiment) is covered with the second barrier film 10.

The Cu wiring portion 19 is made of a Cu alloy mainly composed of Cu similarly to the first Cu wiring 2, and integrally includes the second Cu wiring 11 embedded in the trench 7 and the connection via 18 embedded in the via hole 6. The Cu wiring portion 19 is embedded in the wiring trench 8, so that the second Cu wiring 11 has a damascene wiring structure.

A second diffusion preventing layer 12 made of SiC and an interlayer insulating film 13 made of SiOC are laminated in this order on the Cu wiring portion 19 (the second Cu wiring 11) and the interlayer insulating film 5, similarly to the aforementioned first diffusion preventing film 3 and interlayer insulating film 5. Cu wiring (not shown) similar the second Cu wiring 11 is formed in the second diffusion preventing film 12 and the interlayer insulating film 13, and electrically connected with the second Cu wiring 11 through a connection via (not shown).

The semiconductor device 1 includes an electrode pad for electrical connection with an external, for example, while illustration and description thereof are omitted.

FIGS. 2A to 2I are illustrative sectional views showing a method of manufacturing the semiconductor device 1 shown in FIGS. 1A and 1B along the steps.

Figure 2A:
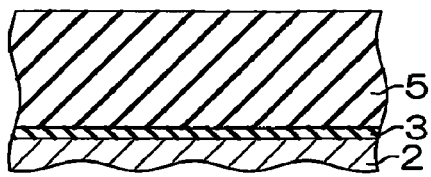
FIG. 2A is an illustrative sectional view showing a method of manufacturing the semiconductor device shown in FIGS. 1A and 1B along the steps.

In order to manufacture the semiconductor device 1, the first Cu wiring 2 is first formed on the semiconductor substrate (not shown) by the damascene process. Then, the first diffusion preventing film 3 and the interlayer insulating film 5 are successively formed on the first Cu wiring 2 by plasma CVD (Chemical Vapor Deposition), for example, as shown in FIG. 2A.

Figure 2B:
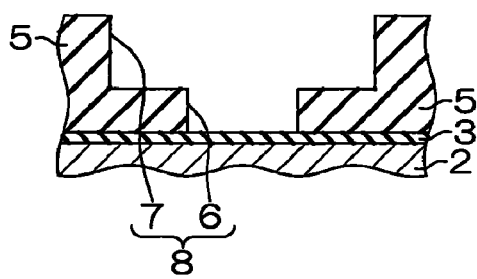
FIG. 2B is a schematic sectional view showing the next step of FIG. 2A.

Then, the wiring trench 8 (the via hole 6 and the trench 7) is formed in the interlayer insulating film 5 by well-known photolithography and etching, as shown in FIG. 2B. Thus, the first diffusion preventing film 3 is partially exposed from the via hole 6.

Figure 2C:
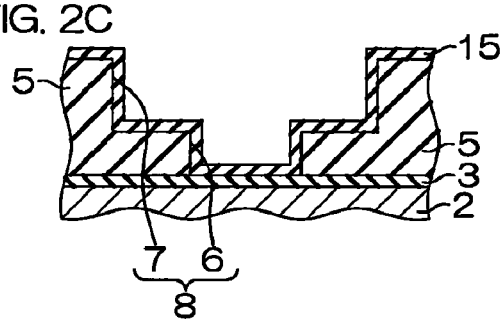
FIG. 2C is a schematic sectional view showing the next step of FIG. 2B.

After the formation of the wiring trench 8, an oxide film 15 made of $SiO_2$ or SiCO is formed by plasma CVD, for example, to cover the surface of the interlayer insulating film 5 (including the inner surface of the wiring trench 8) and the exposed surface of the first diffusion preventing film 3, as shown in FIG. 2C. Even if the recesses 14 (see FIG. 1B) are formed on the inner surface of the wiring trench 8, the oxide film 15 fills up these recesses 14.

Figure 2D:
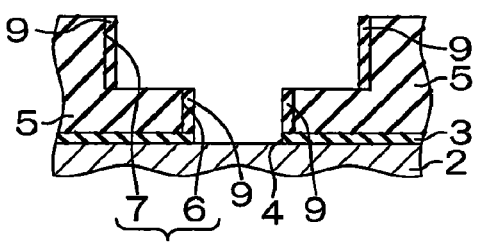
FIG. 2D is a schematic sectional view showing the next step of FIG. 2C.

Then, the oxide film 15 and the first diffusion preventing film 3 are etched in the thickness direction of the first diffusion preventing film 3, as shown in FIG. 2D. This step is carried out by dry etching, for example. Thus, parts of the oxide film 15 located on the interlayer insulating film 5 and the trench 7 are removed, and the remaining part of the oxide film 15 forms the first barrier film 9 covering the side surfaces 6B and 7B of the via hole 6 and the trench 7. The part of the first diffusion preventing film 3 located on the first Cu wiring 2 is removed, to expose the upper surface of the first Cu wiring 2.

Figure 2E:
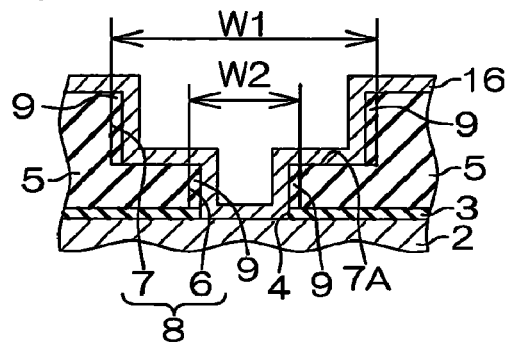
FIG. 2E is a schematic sectional view showing the next step of FIG. 2D.

Then, the entire surface of the interlayer insulating film 5 including the inner surface of the wiring trench 8 (the surface of the first barrier film 9, the bottom surface 7A of the trench 7 and the exposed surface of the first Cu wiring 2) is covered with an alloy film 16 made of an alloy of Cu and Mn, for example, by sputtering, for example, as shown in FIG. 2E. This alloy film 16 contains 1 atomic percent to 5 atomic percent of Mn, for example. The alloy film 16 is so formed that the thickness thereof is 60 nm to 100 nm if the width W1 of the trench 7 is 100 nm to 1000 nm and the width w2 of the via hole 6 is 100 nm to 300 nm, for example.

Figure 2F:
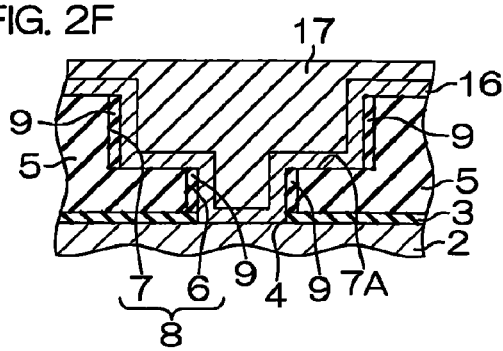
FIG. 2F is a schematic sectional view showing the next step of FIG. 2E.

Then, a Cu film 17 is formed on the alloy film 16 (the interlayer insulating film 5) by plating, for example, as shown in FIG. 2F. This Cu film 17 is formed in such a thickness as to fill up the wiring trench 8 and cover the entire surface of the alloy film 16.

Figure 2G:
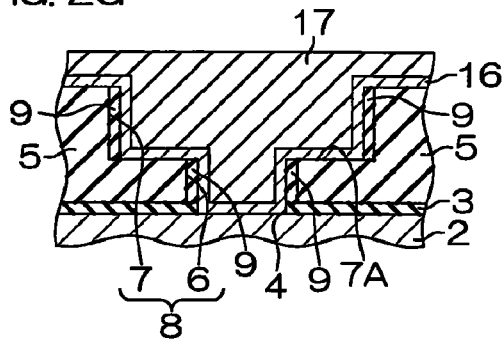
FIG. 2G is a schematic sectional view showing the next step of FIG. 2F.

Thereafter the structure including the interlayer insulating film 5, the first barrier film 9, the alloy film 16, the Cu film 17, etc. is introduced into an annealing furnace (not shown), and heat-treated (annealed) in an $N_2$ (nitrogen) atmosphere under a temperature condition of 400° C., for example, for 30 minutes. Due to this heat treatment, Mn contained in the alloy film 16 is bonded to Si and O contained in the interlayer insulating film 5 and the first barrier film 9, so that the alloy film 16 made of $Mn_xSi_yO_z$ (x, y and z: numbers greater than zero) is formed on the interface between the alloy film 16 and the interlayer insulating film 5 and between the alloy film 16 and the first barrier film 9, as shown in FIG. 2G.

Figure 2H:
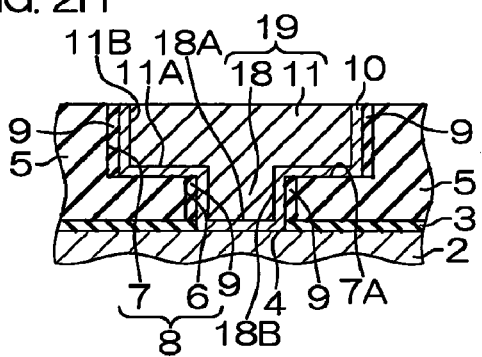
FIG. 2H is a schematic sectional view showing the next step of FIG. 2G.

Then, the Cu film 17 and the alloy film 16 are polished by CMP (Chemical Mechanical Polishing). In this polishing, unnecessary parts of the Cu film 17 and the alloy film 16 outside the wiring trench 8 are entirely removed, as shown in FIG. 2H. In other words, this polishing step is continued until the surface of the interlayer insulating film 5 outside the wiring trench 8 is exposed and becomes flush with the surface of the Cu film 17 in the wiring trench 8. Thus, the Cu film 17 and the alloy film 16 remain only in the wiring trench 8, and the Cu film 17 remaining in the wiring trench 8 forms the Cu wiring portion 19. The alloy film 16 remaining in the wiring trench 8 serves as the second barrier film 10 covering the surface of the Cu wiring portion 19 opposed to the wiring trench 8 (the bottom and side surfaces 11A and 11B of the Cu wiring 11 and the bottom and side surfaces 18A and 18B of the connection via 18).

Figure 2I:
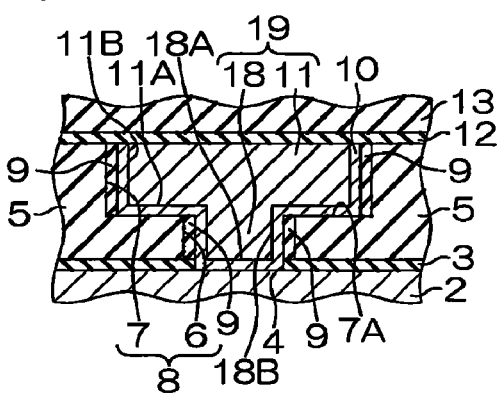
FIG. 2I is a schematic sectional view showing the next step of FIG. 2H.

Then, the second diffusion preventing film 12 and the interlayer insulating film 13 are formed similarly to the first diffusion preventing film 3 and the interlayer insulating film 5, thereby to obtain the semiconductor device 1, as shown in FIG. 2I.

As hereinabove described, the first barrier film 9 made of $SiO_2$ or SiCO having a larger film density than SiOC is formed on the inner surface of the wiring trench 8 (the side surfaces 7B and 6B of the trench 7 and the via hole 6). When the second barrier film 10 is formed, therefore, the CuMn alloy (the alloy film 16) covering the inner surface of the wiring trench 8 can be prevented from infiltrating into the interlayer insulating film 5. Even if the thickness of the alloy film 16 is reduced, therefore, a sufficient quantity of Mn can be ensured for forming the second barrier film 10.

Even if the recesses 14 are partially present on the inner surface of the wiring trench 8 (the side surfaces 7B and 6B of the trench 7 and the via hole 6), the first barrier film 9 fills up these recesses 14, whereby the surface provided with the alloy film 16 can be planarized. Therefore, the thickness of the alloy film 16 may not be increased in order to planarize the inner surface of the wiring trench 8 by filling up the recesses 14. In other words, the thickness of the alloy film 16 can be reduced.

Thus, the thickness of the alloy film 16 can be reduced, so that Mn contained in the alloy film 16 is not left over as the constituent of the second barrier film 10 when the second barrier film 10 is formed, but bonded to Si and O. Therefore, Mn does not diffuse into the second Cu wiring 11. Consequently, increase in the wiring resistance of the second Cu wiring 11 can be prevented.

The surface of the Cu wiring portion 19 opposed to the wiring trench 8 (the bottom and side surfaces 11A and 11B of the Cu wiring 11 and the bottom and side surfaces 18A and 18B of the connection via 18) is covered with the second barrier film 10. Therefore, Cu can be prevented from diffusing into the interlayer insulating film 5 from the Cu wiring portion 19.

When the first barrier film 9 (made of $SiO_2$ or SiCO) and the interlayer insulating film 5 (made of SiOC) are identical in volume to each other, the first barrier film 9 has a larger content of O. Therefore, Mn contained in the alloy film 16 can be easily reacted with O, whereby the second barrier film 10 (made of $Mn_xSi_yO_z$) can be efficiently formed.

While the embodiment of the present invention has been described, the present invention may also be carried out in another embodiment.

Figure 3:
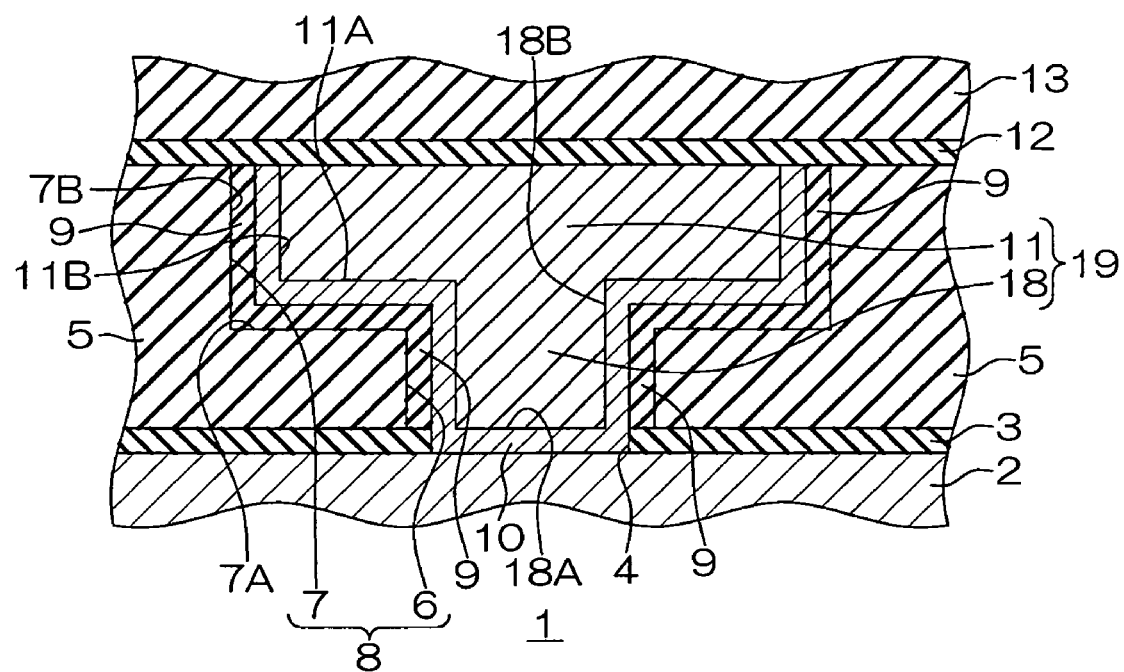
FIG. 3 is an illustrative sectional view for illustrating the structure of a semiconductor device according to a second embodiment of the present invention.

While the first barrier film 9 is formed on the side surfaces 6B and 7B of the via hole 6 and the trench 7 in the aforementioned embodiment, the first barrier film 9 may alternatively be formed on the entire inner surface of the wiring trench 8 (the side surface 6B of the via hole 6, the side surface 7B of the trench 7 and the bottom surface 7A of the trench 7), as shown in FIG. 3.

While the interlayer insulating film 5 is made of SiOC in the aforementioned embodiment, the interlayer insulating film 5 may alternatively be made of SiOF.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application No. 2007-135160 filed with the Japanese Patent Office on date May 22, 2007, the disclosure of which is incorporated herein by reference.

What is claimed is:

1. A semiconductor device comprising:
   a first Cu wiring;
   an insulating film made of a low dielectric constant material having a smaller specific dielectric constant than $SiO_2$ and laminated on the first Cu wiring;
   a wiring trench including a trench portion dug in the insulating film from a surface thereof toward the first Cu wiring and a via hole reaching the first Cu wiring from a bottom surface of the trench portion;
   a first barrier film made of $SiO_2$ or SiCO having a larger film density than the insulating film, formed on entire side surfaces of the trench portion and the via hole;
   a second Cu wiring mainly composed of Cu embedded in the trench portion and the via hole; and
   a second barrier film made of a compound containing Si, O and a predetermined metallic element formed on inner surfaces of the trench portion and the via hole including a region located on the first barrier film, the second barrier film covering a surface of the second Cu wiring opposed to the trench portion and the via hole, wherein
   the second barrier film is arranged inside the wiring trench,
   a plurality of recesses are formed on a side surface of the wiring trench, and
   the first barrier film fills up the recesses.

2. The semiconductor device according to claim 1, wherein the predetermined metallic element is Mn.

3. The semiconductor device according to claim 1, wherein the first barrier film contains C.

4. The semiconductor device according to claim 3, wherein the first barrier film contains 50 atomic percent to 70 atomic percent of C and 4 atomic percent to 11 atomic percent of 0.

5. The semiconductor device according to claim 1, wherein the insulating film is made of SiOC or SiOF.

6. The semiconductor device according to claim 1, wherein a diffusion preventing layer is formed on the second Cu wiring embedded in the trench portion and the via hole.

7. The semiconductor device according to claim 6, wherein the diffusion preventing layer is made of SiC.

* * * * *